(12) United States Patent
Hui

(10) Patent No.: US 8,086,434 B2
(45) Date of Patent: Dec. 27, 2011

(54) METHODS FOR OPTIMAL OPERATION OF LIGHT EMITTING DIODES

(75) Inventor: Ron Shu Yuen Hui, Shatin (HK)

(73) Assignee: City University of Hong Kong, Kowloon (HK)

( * ) Notice: Subject to any disclaimer, the term of this patent is extended or adjusted under 35 U.S.C. 154(b) by 221 days.

(21) Appl. No.: 12/370,101

(22) Filed: Feb. 12, 2009

(65) Prior Publication Data

US 2010/0202141 A1    Aug. 12, 2010

(51) Int. Cl.
*G06G 7/62* (2006.01)
*F21V 33/00* (2006.01)
*G06F 17/50* (2006.01)

(52) U.S. Cl. ..... 703/13; 362/234; 362/218; 362/249.02; 362/800

(58) Field of Classification Search ............... 362/294, 362/218, 249.02, 800, 234; 703/13
See application file for complete search history.

(56) References Cited

U.S. PATENT DOCUMENTS

| | | | |
|---|---|---|---|
| 6,970,811 B1* | 11/2005 | Boerger et al. | 703/2 |
| 7,523,028 B2* | 4/2009 | Nakamura | 703/13 |
| 7,586,281 B2* | 9/2009 | Cohen et al. | 318/471 |
| 7,801,716 B2* | 9/2010 | Freier | 703/13 |
| 2005/0146879 A1* | 7/2005 | Takahashi et al. | 362/296 |
| 2005/0265035 A1* | 12/2005 | Brass et al. | 362/451 |
| 2006/0122619 A1* | 6/2006 | Kablik et al. | 606/88 |
| 2008/0306719 A1* | 12/2008 | Freier | 703/13 |

* cited by examiner

*Primary Examiner* — Stephen F Husar
*Assistant Examiner* — James Cranson, Jr.
(74) *Attorney, Agent, or Firm* — Heslin Rothenberg Farley & Mesiti P.C.

(57) ABSTRACT

LED illumination systems are formed with a suitable choice of LED and/or heatsink, such that an optimum operating power is identified using computer modeling for a desired output luminous flux, given the constraints of the rated power of the LED and the heatsink.

9 Claims, 13 Drawing Sheets

US 8,086,434 B2

METHODS FOR OPTIMAL OPERATION OF LIGHT EMITTING DIODES

FIELD OF THE INVENTION

This invention relates to light emitting diodes (LEDs) and to systems formed from multiple LEDs that maximizes the luminous flux output from a given thermal design of LED system.

BACKGROUND OF THE INVENTION

A light emitting diode (LED) is a semiconductor device that emits light when a current is passed through it in a forward direction. Many types of LEDs are known that emit light in various wavelengths including infra-red, visible and ultra-violet regions. Many applications for LEDs are known including as indicator lights of various colors, for use in advertising displays, and in video displays.

In the past LEDs have tended to be lower power devices that produce relatively low power outputs and have not been used for general illumination purposes. More recently, however, high-power LED devices have become known that can provide an alternative to incandescent and fluorescent light sources. LED devices produce more light per watt than incandescent light sources and may therefore be useful as energy efficient light sources, while they have a number of advantages over fluorescent light sources including being easier to dim and not requiring the use of potentially toxic and polluting elements such as mercury to create the plasma that is the source of fluorescent light.

Light emitting diodes (LEDs) have therefore emerged as promising lighting devices for the future. However, LEDs are still primarily restricted to decorative, display and signaling applications so far and have not yet entered the market for general illumination to any great extent.

In photometry, one important factor that is commonly used for comparing different lighting devices is the luminous efficacy (lumen per Watt). One major hindrance to the widespread use of LEDs in general illumination applications is that the luminous flux of LEDs decreases with the junction temperature of the LEDs. The luminous efficacy of various LEDs typically decreases by approximately 0.2% to 1% per decree Celsius rise in temperature. Due to the aging effect, the actual degradation of luminous efficacy could be higher than this quoted figures. Accelerated aging tests show that the light output can drop by a further 45%. For aged LEDs, the efficacy degradation rate could be up to 1% per ° C. In some applications such as automobile headlights and compact lamps, the ambient temperature could be very high and the size of the heatsink is limited. The drop in luminous efficacy due to thermal problem would be serious, resulting in reduction of luminous output.

FIG. 1 shows a conventional LED 9. At the heart of the LED device is a light emitting semiconductor material such as InGaN though other materials will be known to those skilled in the art. In the example of FIG. 1 a light-emitting InGaN chip 1 is mounted on a silicon substrate 2 and is connected to electrodes such as cathode 3 through gold wires 4 and solder connection 5. The light-emitting chip 1 is covered by a silicone encapsulant 6 and a plastic lens 7.

When a LED of the type shown in FIG. 1 is used to generate light a substantial amount of heat is generated that will damage the light-emitting chip if not removed. Therefore a heat sink must be provided and beneath the light-emitting chip 1 is a heatsink slug 8. In practice when used to provide a source of light for illumination, conventionally multiple LEDs are provided to form a LED system 10 as shown in FIG. 2 where multiple LEDs 11 are provided on a single heatsink 12.

SUMMARY OF THE INVENTION

According to the present invention there is provided a method of forming an LED illumination system comprising a single or a plurality of LEDs on a heatsink with a desired output flux, comprising the steps of: (a) modeling on a computer the luminous flux emitted by said LED system as a function of the thermal resistance of said heatsink and the power applied to each LED, and (b) selecting an LED system such that the maximum luminous flux is emitted at a power equal to or below a rated power of said LED system provided that said maximum luminous flux is equal to or greater than the desired output flux, or (c) selecting an LED such that the rated power of said LED system is below the power at which the maximum luminous flux is emitted, provided that the flux emitted by said LED system at said rated power is equal to or greater than the desired output flux.

Preferably, in option (c) the rated power is at between 80% and 96% of the power at which maximum flux would be output.

Viewed from another aspect the present invention provides a method of forming an LED illumination system comprising a single or a plurality of LEDs on a heatsink with a desired output flux, comprising the steps of: (a) modeling on a computer the luminous flux emitted by said LED system as a function of the thermal resistance of said heatsink and the power applied to each LED, and (b) selecting a heatsink having a thermal resistance such that the maximum luminous flux is emitted at a power equal to or below a rated power of said LEDs, or (c) selecting a heatsink having a thermal resistance such that the rated power of said LED system is below the power at which the maximum luminous flux is emitted, provided that the flux emitted by said LED system at said rated power is equal to or greater than the desired output flux.

Preferably in step (c) the rated power is at between 80% and 96% of the power at which maximum flux would be output.

Viewed from another broad aspect the present invention provides an LED illumination system comprising a plurality of LEDs on a heatsink, wherein said heatsink has a thermal resistance such that the maximum luminous flux is emitted at a power below a rated power of said LEDs.

According to the present invention there is also provided a method of forming an LED illumination system comprising a plurality of LEDs on a heatsink with a desired output flux, comprising the steps of: (a) selecting an LED system such that the maximum luminous flux is emitted at a power below a rated power of said LED system provided that said maximum luminous flux is equal to or greater than the desired output flux, or (b) selecting an LED such that the rated power of said LED system is below the power at which the maximum luminous flux is emitted, provided that the flux emitted by said LED system at said rated power is equal to or greater than the desired output flux.

Viewed from a still further aspect the present invention provides a method of forming an LED illumination system comprising a plurality of LEDs on a heatsink with a desired output flux, comprising the steps of: (a) selecting a heatsink having a thermal resistance such that the maximum luminous flux is emitted at a power below a rated power of said LEDs, or (b) selecting a heatsink having a thermal resistance such that the rated power of said LED system is below the power at which the maximum luminous flux is emitted, provided that the flux emitted by said LED system at said rated power is equal to or greater than the desired output flux.

BRIEF DESCRIPTION OF THE DRAWINGS

Some embodiments of the present invention will now be described by way of example and with reference to the accompanying drawings, in which.

DETAILED DESCRIPTION OF PREFERRED EMBODIMENTS

To increase the light emitted from a conventional LED system it is necessary to increase the current applied to the LED. Continuing to increase the LED power will have diminishing returns, however, as the increasing temperature of the LED will reduce its efficiency and potentially damage the LED. The heatsink is therefore important as it is essential for heat to be carried away from the LED so as not to cause it any damage. The light emitted by a LED will increase with applied current provided that the heat produced can be removed, but for any individual LED design there will come a point where increasing power applied to the LED will not result in greater light being emitted because heat is no longer being effectively removed. Identifying the relationship between power applied and light emitted is an important aspect of the present invention.

Let $\phi_v$ be the total luminous flux of an LED system consisting of N LED devices.

$$\phi_v = N \times E \times P_d \quad (1)$$

where E is efficacy (lumen/Watt) and $P_d$ is the real power of one LED (W)

Figure 1:
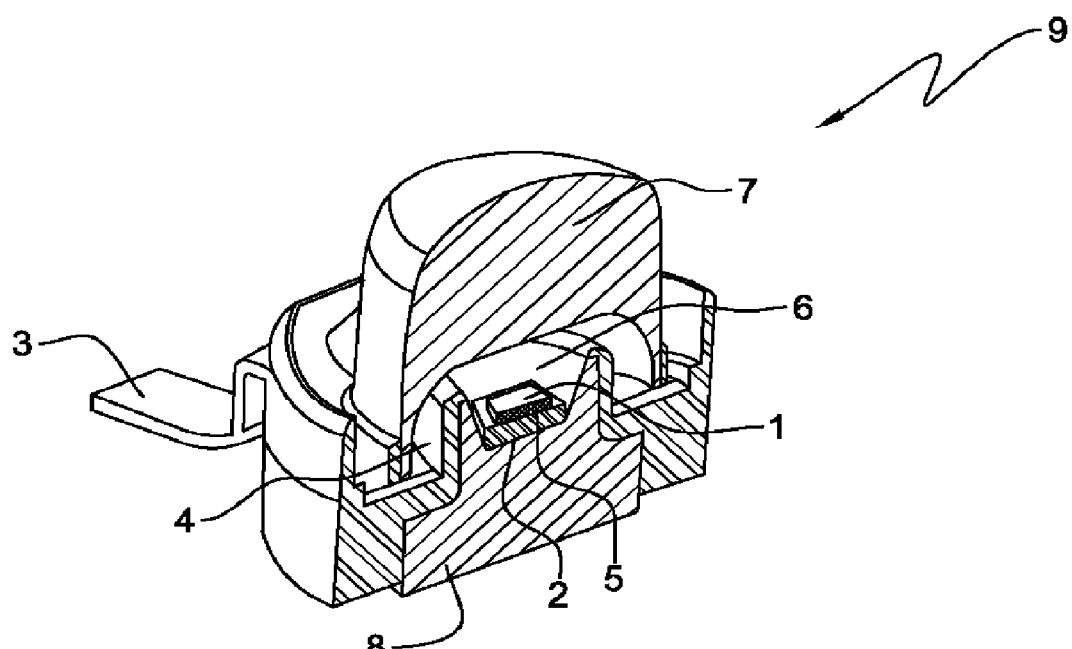
FIG. 1 shows schematically the structure of a conventional LED.
Figure 2:
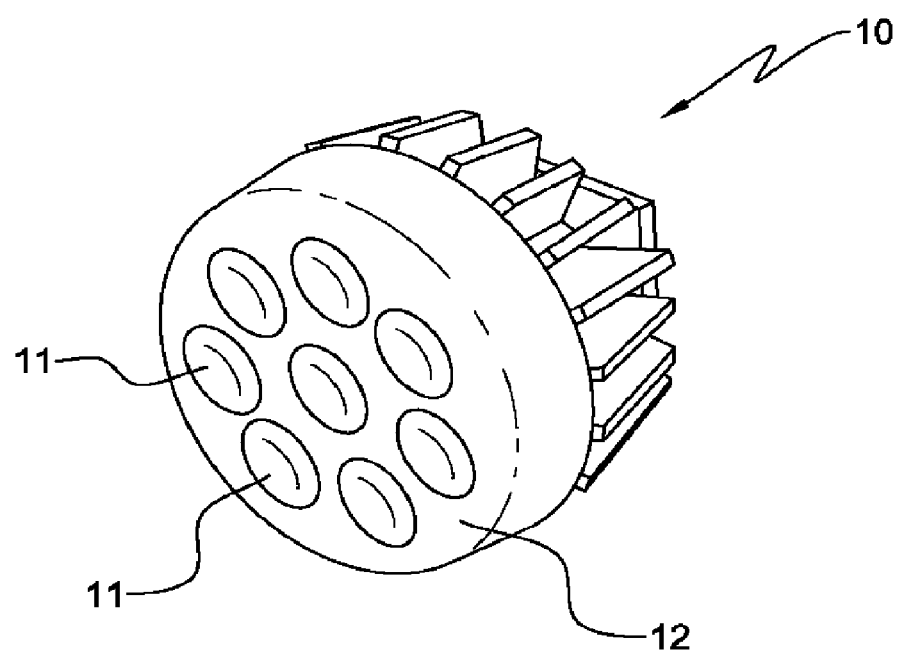
FIG. 2 shows a conventional system with multiple individual LEDs mounted on a single heatsink.
Figure 3:
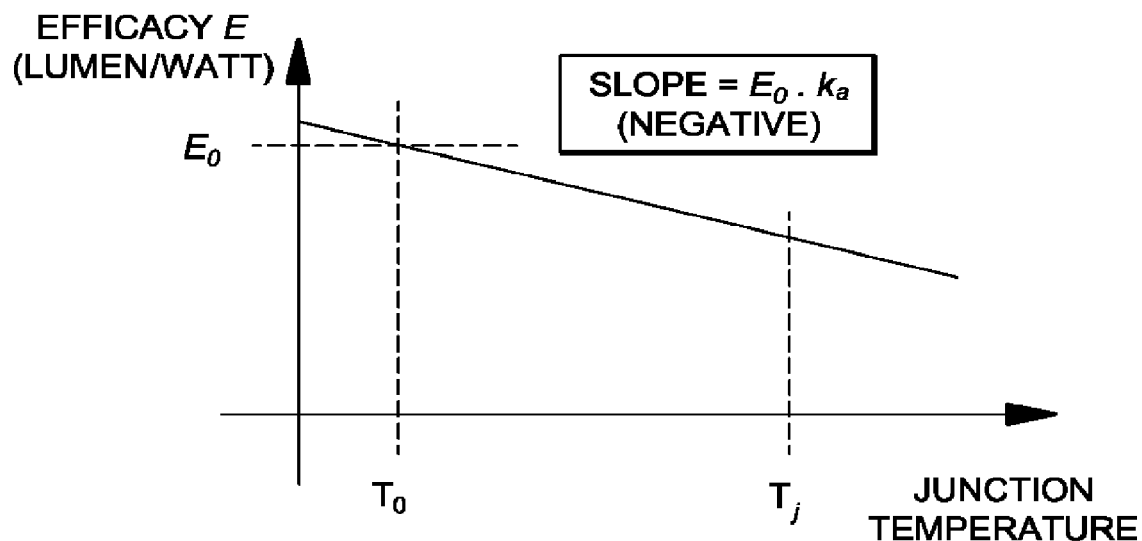
FIG. 3 is a plot of the typical relationship between efficacy of LEDs versus junction temperature.

It is well known that the efficacy (E) of LEDs will decrease with increasing junction temperature of the LEDs. FIG. 3 shows a typical relationship provided by an LED manufacturer. It can be seen that:

$$E = E_o \lfloor 1 + k_e(T_j - T_o) \rfloor \text{ for } T_j \leq T_o \text{ and } E \leq 0 \quad (2)$$

where $E_o$ is the rated efficacy at the rated temperature $T_o$ (typically 25° C.) and $k_e$ is the relative reduction of efficacy with increase in temperature. For example, if E reduces by 20% over a temperature increase of 100° C., then $k_e$=0.002.

In general, the LED power can be defined as $P_d = V_d \times I_d$, where $V_d$ and $I_d$ are the diode voltage and current respectively. But only part of the power will be dissipated as heat. Thus, the heat generated in one LED is defined as:

$$P_{heat} = k_h P_d = k_h V_d I_d \quad (3)$$

where $k_h$ is a constant less than 1.

Figure 4:
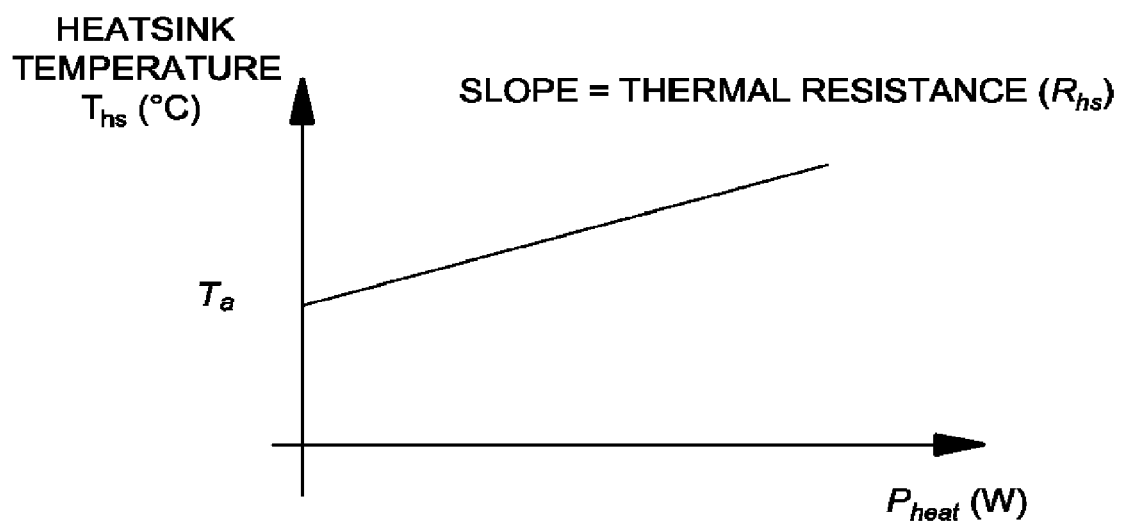
FIG. 4 is a plot of the typical relationship between heatsink temperature and power dissipation, FIGS. 5(a) and (b) show (a) simplified dynamic thermal equivalent circuit of NLEDs mounted on the same heatsink, and (b) a simplified steady-state thermal equivalent circuit with N LEDs mounted on the same heatsink.
Figure 5A:
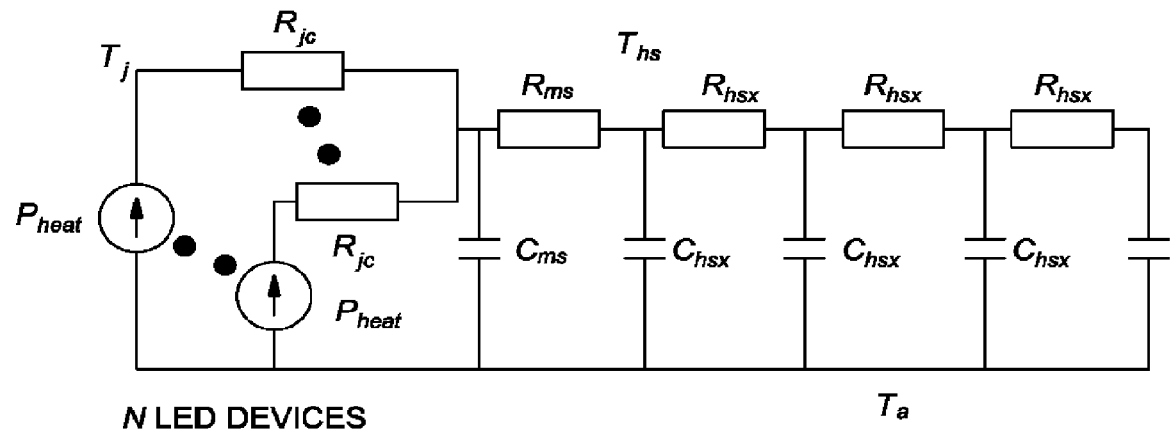

Now consider a typical relationship of the heatsink temperature and the heat generated in the LED system as shown in FIG. 4. A simplified dynamic thermal equivalent circuit of a LED system is shown in FIG. 5(a), assuming that (i) the N LEDs are placed on the same heatsink with thermal resistance of $R_{hs}$, (ii) each LED has a junction to case thermal resistance $R_{jc}$ and (iii) a thermal conductor with electrical isolation (such as heatsink compound) is used to isolate the LEDs from the heatsink and which has a thermal resistance of $R_{ins}$. A distributed thermal model is used for the heatsink due to its relatively large size. The corresponding thermal capacitances are needed if dynamic response is to be studied.

Figure 5B:
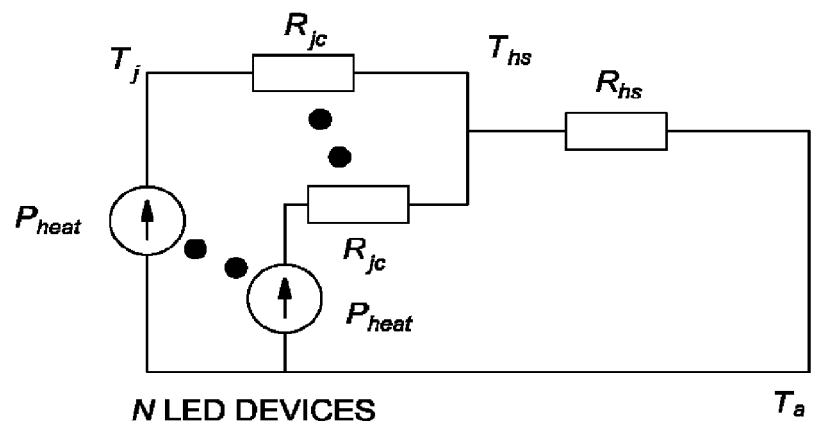

Under steady-state conditions, the thermal model can be further simplified into a steady-state model as shown in FIG. 5(b). In practice, a heat sink compound or equivalent may be used between the LEDs and the heat sink to ensure good thermal contact. The thermal resistance of such thermal conductor/electric insulator is relatively small when compared with $R_{jc}$ of LEDs and is neglected in FIG. 5(b) and the following equations.

Based on the model in FIG. 5(b), the steady-state heatsink temperature can be expressed as:

$$T_{hs} = T_a + R_{hs}(NP_{heat}) = T_a + R_{hs}(Nk_h P_d) \quad (4)$$

where $T_a$=ambient temperature.

From FIGS. 5(b) and (4), the junction of each LED is therefore:

$$T_j = T_{hs} + R_{jc}(P_{heat}) = T_{hs} + R_{jc}(k_h P_d) \quad (5a)$$

$$T_j = T_a + (R_{jc} + NR_{hs})k_h P_d \quad (5b)$$

Now, $T_j$ obtained in (5) can be used in (2):

$$E = E_o[1 + k_e(T_j - T_o)]$$

$$E = E_o\{1 + k_e[T_a + (R_{jc} + NR_{hs})k_h P_d - T_o]\}$$

$$E = E_o[1 + k_e(T_a - T_o) + k_e k_h(R_{jc} + NR_{hs})P_d] \quad (6)$$

So, the total luminous flux $\phi_v$ is:

$$\phi_v = NEP_d$$

$$\phi_v = N\{E_o[1 + k_e(T_a - T_o) + k_e k_h(R_{jc} + NR_{hs})P_d]\}P_d$$

$$\phi_v = NE_o\{[1 + k_e(T_a - T_o)]P_d + k_e k_h(R_{jc} + NR_{hs})P_d^2\} \quad (7a)$$

Equation (7a) can also be expressed as follows:

$$\phi = NE_o\{P_d + [k_e(T - T_o)]P_d + k_e k_h(R_{jc} + NR_{hs})P_d^2\} \quad (7b)$$

Several important observations can be made from equations (7a) and (7b).

1. Equation (7) relates the luminous flux ($\phi_v$) to the electrical power of the LED ($P_d$) and the thermal resistance of the heatsink ($R_{hs}$) and the LED junction ($R_{jc}$) together. It is an equation that integrates the photometric, electrical and thermal aspects of the LED system together.
2. For a given heatsink (that may be restricted in size by a specific application), the operating point $P_d^*$ at which maximum $\phi_v$ occurs can be determined. Alternatively where there is flexibility in designing the heatsink, the equations can be used for thermal design to optimize the size of the heatsink ($R_{hs}$) for a given LED array.
3. Because $k_e$ is negative and less than 1, (7) is in the form of $\phi_v = a_1 P_d - a_2 P_d^2$ where $a_1$ and $a_2$ are two positive coefficients. As $P_d$ is increased from zero, $\phi_v$ increases almost linearly because the second term is negligible when $P_d$ is small. As $P_d$ increases, the second negative term which is proportional to the square of $P_d$ will reduce $\phi_v$ significantly. After reaching the maximum point, the $\phi_v$ will drop faster as $P_d$ and $R_{jc}$ increase (due to the increasing significance of the negative terms in (7b)). This means that the parabola of $\phi_v$ is not symmetrical. Since the luminous flux function is a parabola and therefore has a maximum value, this maximum point can be obtained from $$\frac{d\phi_v}{dP_d} = 0.$$

By differentiating (7) with respect to $P_d$, $$\frac{d\phi_v}{dP_d} = NE_o \left\{ \begin{array}{l} [1 + k_e(T_a - T_o)] + 2k_e k_h(R_{jc} + NR_{hs})P_d + \\ \left[ \begin{array}{l} (T_a - T_o)P_d + \\ k_h(R_{jc} + NR_{hs})P_d^2 \end{array} \right] \frac{dk_e}{dP_d} + \\ [k_e(R_{jc} + NR_{hs})P_d^2] \frac{dk_h}{dP_d} + (k_e k_h P_d^2) \frac{dR_{jc}}{dP_d} \end{array} \right\} \quad (8)$$

It should be noted that the first two terms on the right hand side of (8) do not have derivatives, while the remaining three terms do. Strictly speaking, $k_e$, $k_h$ and $R_{jc}$ are not constant. It must be noted that $R_{jc}$ will indeed increase significantly with lamp power.

The above equations can usefully be simplified for practical applications. As a first approximation, it is assumed that $k_e$, $k_h$, and $R_{jc}$ are constant for the time being. It is known that $k_h$ will reduce slightly for a few percent under dimming conditions. From LED manufacturer data sheets the degradation of the efficacy with junction temperature is usually assumed to be linear and thus $k_e$ is assumed to be constant. This assumption is acceptable for $k_e$ and $k_h$, and will be relaxed to accommodate the changing nature of $R_{jc}$ in the analysis later. Based on this assumption, (8) can be simplified as:

$$\frac{d\phi_v}{dP_d} = NE_o\{[1 + k_e(T_a - T_o)] + 2[k_e k_h(R_{jc} + NR_{hs})]P_d\} \quad (9)$$

Therefore, maximum-$\phi_v$ point can be obtained by putting $$\frac{d\phi_v}{dP_d} = 0 \text{ and } P_d^* = -\frac{[1 + k_e(T_a - T_o)]}{2k_e k_h(R_{jc} + NR_{hs})} \quad (10)$$

where $P_d^*$ is the led power at which maximum $\phi_v$ occurs. (Note that $k_e$ is a negative value.)

From (3), the corresponding LED current at which maximum $\phi_v$ occurs can be obtained as:

$$I_d^* = -\frac{[1 + k_e(T_a - T_o)]}{2k_e k_h(R_{jc} + NR_{hs})V_d} \quad (11)$$

Several significant observations can be made from (10) and (11).

1. Equations (10) and (11) relate the optimal $P_d$ and $I_d$, respectively, to the thermal design of the LED system (i.e., thermal resistance of the heatsink $R_{hs}$ and $R_{jc}$).
2. The maximum luminous flux will occur approximately at a lamp power $P_d^*$ specified in (10). This $P_d^*$ will shift to a lower value if ($R_{jc} + NR_{hs}$) is increased. This leads to the possibility that the $P_d^*$ may occur at a power level that is less than the rated power $P_{d(rated)}$ of the LED.
3. Based on the above comment, one should expect that the $P_d^*$ could be shifted to higher power level if a larger heatsink with lower $R_{hs}$ is used.
4. For many applications such as head lamps of vehicles and compact lamps for replacement of incandescent lamps, the size of the heatsink is highly restricted and the ambient temperature is high. In these cases, there is a high possibility that $P_d^*$ (at which maximum luminous flux is produced) will occur at a power level less than the rated power.

In practice, $R_{jc}$ of the LED increases with lamp power. Therefore, a vigorous equation can be obtained from (8) as:

$$\frac{d\phi_v}{dP_d} = NE_o \left\{ \begin{array}{l} [1 + k_e(T_a - T_o)] + \\ 2k_e k_h(R_{jc} + NR_{hs})P_d + (k_e k_h P_d^2) \frac{dR_{jc}}{dP_d} \end{array} \right\} \quad (12)$$

The function of $R_{jc}$ is highly complex and it depends on several factors such as thermal resistance of the heatsink, ambient temperature, the LED size and mounting structure and even the orientation of the heatsink. Equation (7b) in fact provides the physical meaning of effects of the temperature-dependent $R_{jc}$. Since $R_{jc}$ increases with lamp power $P_d$, the two negative terms (with $k_e$ which is negative) in (7b) will accelerate the reduction of the luminous flux as $P_d$ increases. This effect should be noticeable when $P_d$ exceeds the $P_d^*$, resulting in a slightly asymmetric parabolic luminous flux function.

In order to verify the theory two types of LEDs are used: 3 W cool white LEDs and 5 W cool white LEDs from Luxeon K2 Star series. They are mounted on several heatsinks with thermal resistances of 6.3° C./W, 3.9° C./W and 2.2° C./W so that experiments can be performed to evaluate their luminous output under different lamp power operations.

Figure 6:
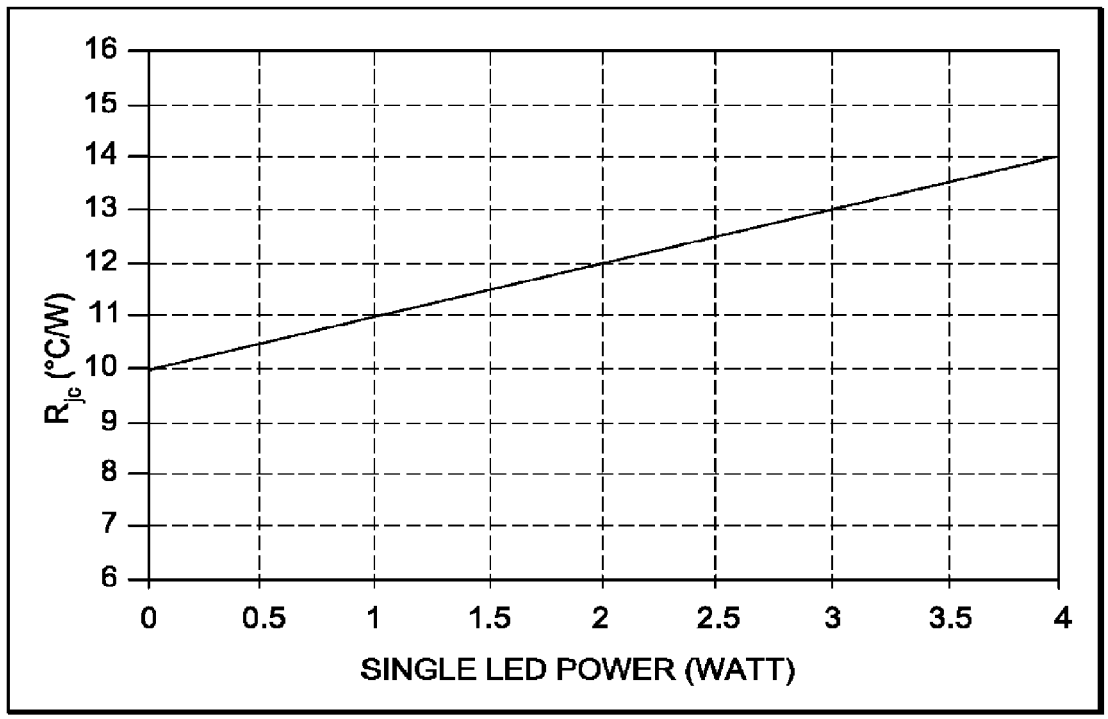
FIG. 6 shows an assumed linear function of junction-to-case thermal resistance $R_{jc}$.

Since the junction-to-case thermal resistance $R_{jc}$ is a complex and nonlinear function of the lamp heat dissipation $P_{heat}$ (which is equal to $k_h P_d$) and the thermal design of the mounting structure, the theoretical prediction is based on a simplified linear function as follows:

$$R_{jc} = R_{jco}(1 + k_{jc} P_d) \quad (13)$$

where $R_{jco}$ is the rated junction-to-case thermal resistance at 25° C. and $k_{jc}$ is a positive coefficient. A typical linear approximation of $R_{jc}$ is shown in FIG. 6.

If equation (13) is used in (7b), a more accurate luminous flux equation can be derived as:

$$\phi_v = N E_o \{[1 + k_e(T - T_o)]P_d + [k_e k_h (R_{jco} + N R_{hs})]P_d^2 + [k_e k_h k_{jc} R_{jco}]P_d^3\} \quad (7c)$$

A Tests on 3 WLEDs
(i) On a Heatsink with Thermal Resistance of 6.3° C./W

A group of eight identical Luxeon K2 Cool-white 3 W LEDs are mounted on a standard heatsink with a thermal resistance of 6.3° C./W. The efficacy of the LEDs is measured at rated power in an integrating sphere. The parameters required for the equation (7) are:

$k_e = -0.005$, $k_h = 0.85$, $T_a = 28°$ C., $T_0 = 25°$ C., $E_0 = 41$ Lumen/Watt, $N = 8$, $R_{hs} = 6.3°$ C./W $R_{jco} = 10°$ C./W and $k_{jc} = 0.1°$ C./W$^2$.

Now two equations can be derived from (7). If the $R_{jc}$ is assumed to be constant as a first approximation (i.e., $R_{jc} = R_{jco}$)

$$\phi_v = 323.08 \times P_d - 84.2 \times P_d^2 \quad (14)$$

If $R_{jc}$ is assumed to obey (13), $$\phi_v = 323.08 \times P_d - 84.2 \times P_d^2 - 1.39 P_d^3 \quad (15)$$

Figure 7:
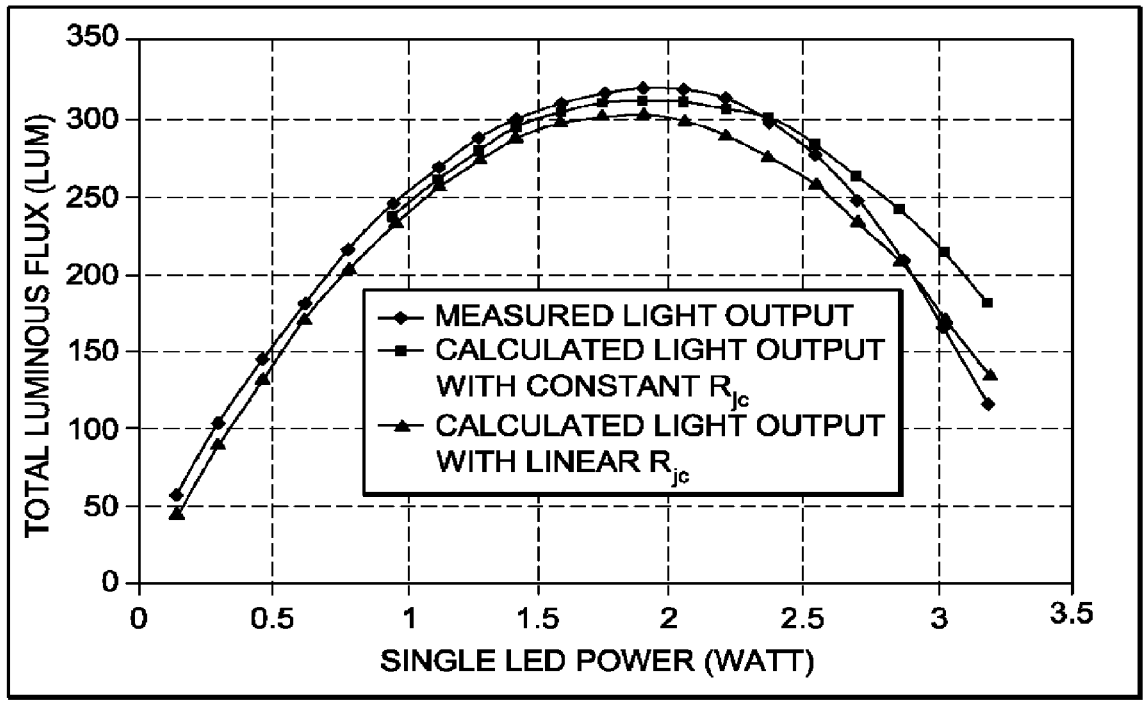
FIG. 7 shows calculated and measured total luminous flux versus lamp power for eight 3 W LEDs mounted on a heatsink with thermal resistance of 6.3° C./W.
Figure 8:
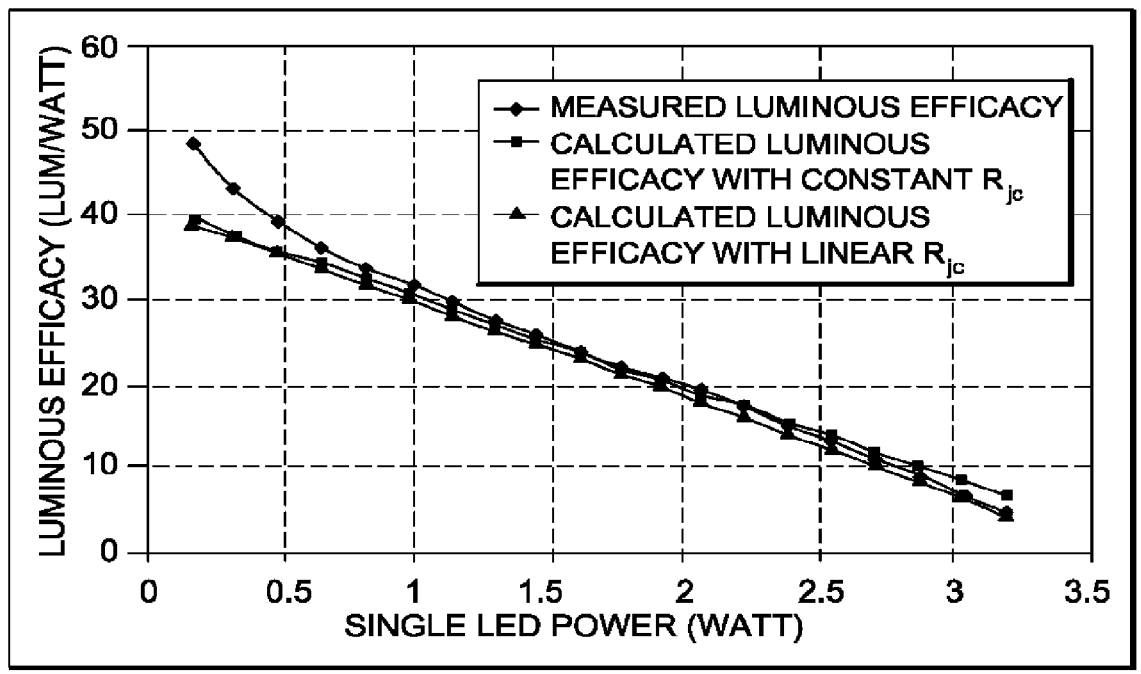
FIG. 8 shows calculated and measured total luminous efficacy versus lamp power for eight 3 W LEDs mounted on a heatsink with thermal resistance of 6.3° C./W.

The luminous flux is measured in an integrating sphere. The measured total luminous flux for eight LEDs is used for comparison with calculated values. The measured and calculated total luminous flux values are plotted, not against the total power sum of eight LEDs but against one LED power because the eight LEDs are identical and are connected in series. Using the power of one LED in the x-axis allows one to check easily if the optimal operating point is at the rated LED power or not. The measured results and calculated results from (14) and (15) are plotted in FIG. 7. Several points should be noted:

1. The theoretical curves generally have the same trends as the measured curve. This confirms the validity of the general theory.
2. The maximum lumen/Watt point occurs at about $P_d = 1.9$ W, which is less than the rated power of 3 W. This result shows that the general theory can predict accurately the $P_d^*$ operating point which may not be the rated power. Equation (10) indicates that a large $NR_{hs}$ term will shift $P_d^*$ to the low power level of the LED.
3. The two negative terms in this example can also be seen in (15). The asymmetry after the peak luminous output point is more noticeable in the theoretical curve obtained from (15) than from (14). Comparison of (14) and (15) shows that the effect of the variation of $R_{jc}$, which is reflected in the extra third term in (15) is the reason for the obvious asymmetry of $\phi_v$.
4. In summary, the simplified model (7b), which is the basis for (14), has the form of $\phi_v = \alpha_1 P_d - \alpha_2 P_d^2$, while the more vigorous model (7c), which is the basis for (15), has the form of $\phi = \alpha_1 P_d - \alpha_2 P_d^2 - \alpha_3 P_d^3$. Therefore, the model in (7c) is more accurate than the model (7b) particularly when $P_d$ has exceeded $P_d^*$. However, since both simplified and vigorous models are accurate enough for the power less than $P_d^*$, which is also the recommended useable power range of LEDs, both equations can be used in the design optimization procedure to be explained.

Based on (6), the efficacy function can also be obtained.

$$E = 40.39 - 10.52 P_d \text{ assuming } R_{jc} \text{ is constant} \quad (16)$$

$$E = 40.39 - 10.52 P_d - 0.17 P_d^2 \text{ assuming } R_{jc} \text{ obeys (13)} \quad (17)$$

The measured efficacy values and the calculated values from (16) and (17) are displayed in FIG. 6. It is noted that the calculated values are consistent with measurements. The results obtained from (17) are more accurate than those from (16) when $P_d$ is large.

(ii) On a Heatsink with Thermal Resistance of 4.5° C./W

Figure 9:
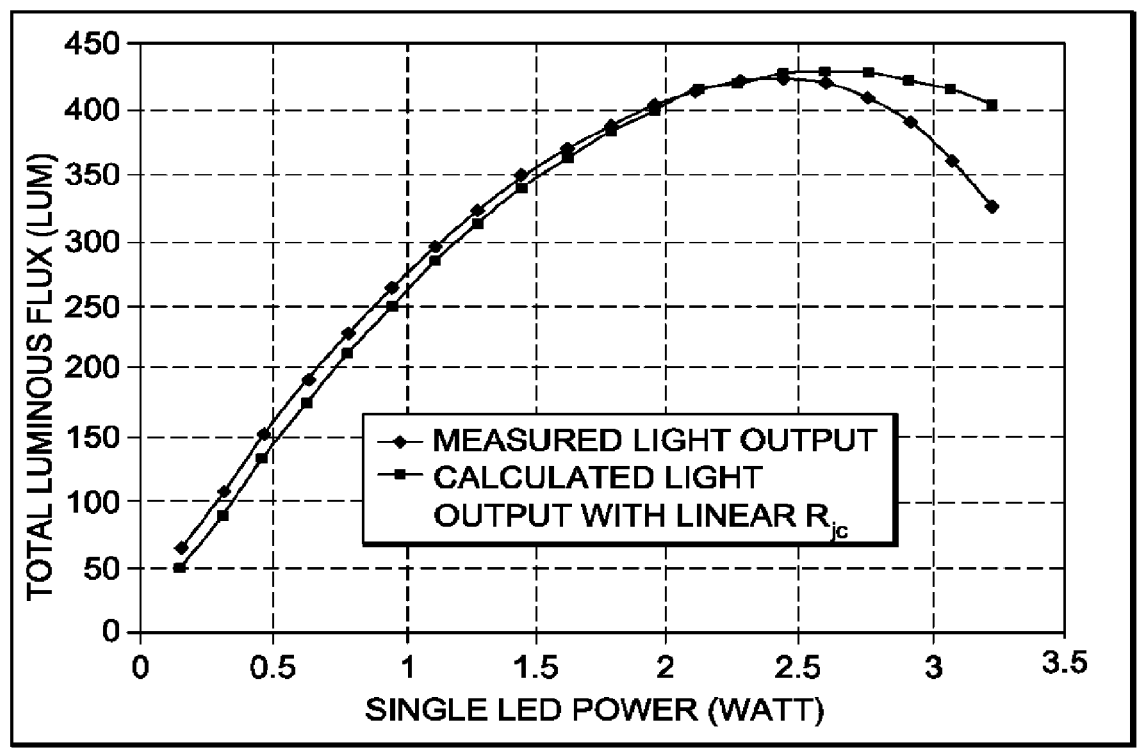
FIG. 9 shows calculated and measured total luminous flux versus lamp power for eight 3 W LEDs mounted on a heatsink with thermal resistance of 4.5° C./W.

Eight identical 3 W LEDs are mounted on a larger heatsink with thermal resistance of 4.5° C./W. The measured and calculated total luminous output as a function of single LED power $P_d$ are shown in FIG. 9. It is noted that the calculated values are generally consistent with measurements, except at very low power where the light output is low and the relative measurement error is large. The $P_d^*$ is 2.4 W at an efficacy of 21 lumens/Watt in this case. The use of a larger heatsink with a smaller thermal resistance means that the $NR_{hs}$ term in the denominator of (10) is smaller than that in the previous case (with $R_{hs} = 6.3°$ C./W). Therefore, $P_d^*$ has increased from 1.9 W to 2.4 W as expected from (10) and the efficacy from 21 lumens/Watt to 23 lumens/Watt.

Figure 10:
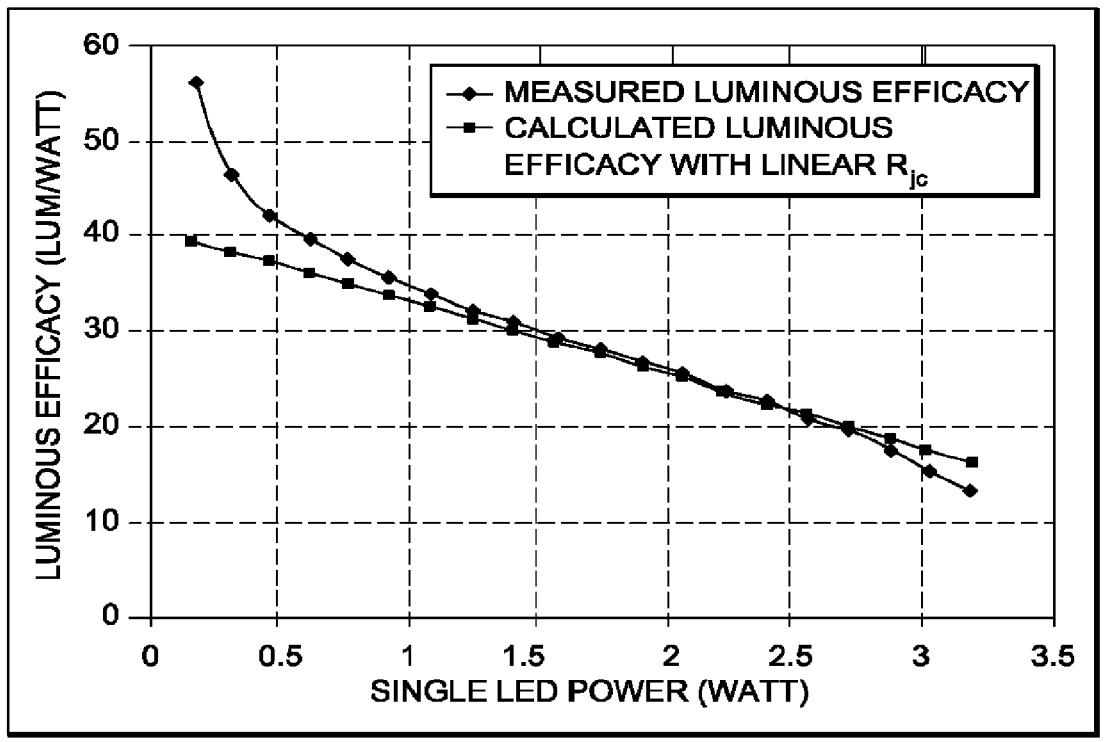
FIG. 10 shows calculated and measured total luminous efficacy versus lamp power for eight 3 W LEDs mounted on a heatsink with thermal resistance of 4.5° C./W.

The corresponding measured and calculated efficacy are shown in FIG. 10 and it can be seen that they are in good agreement.

(iii) On a Heatsink with Thermal Resistance of 2.2° C./W

Figure 11:
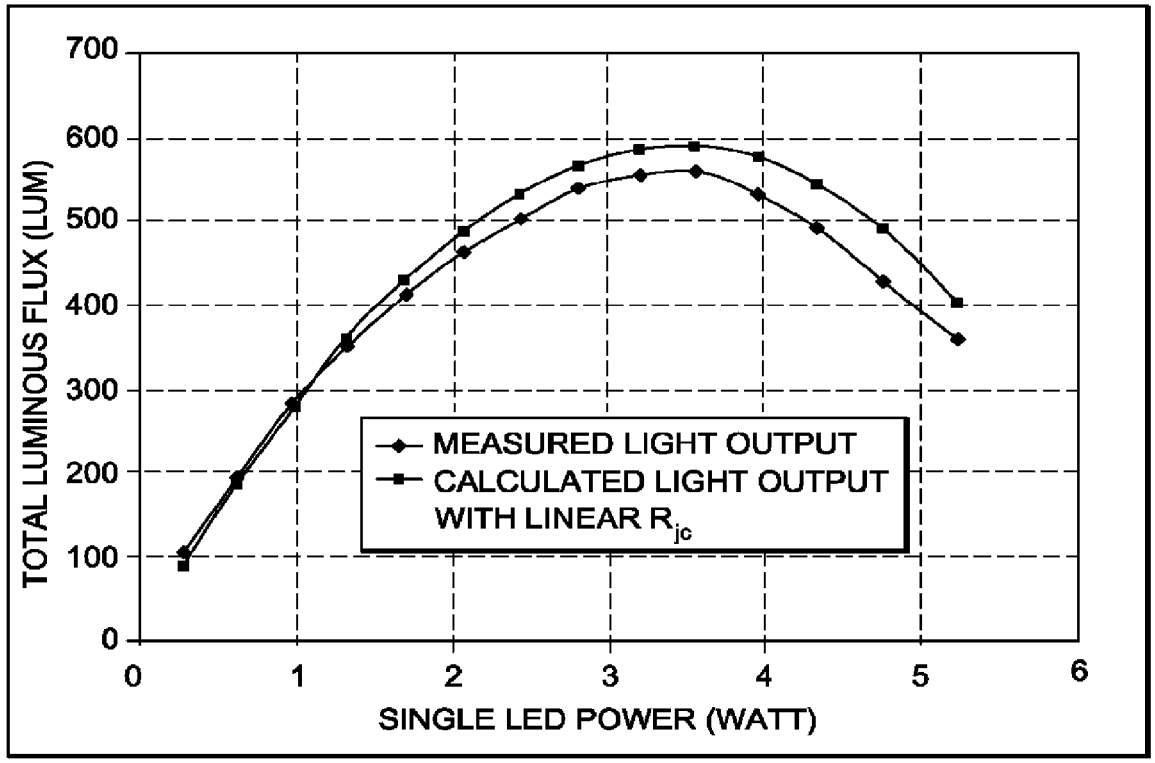
FIG. 11 shows calculated and measured total luminous flux versus lamp power for eight 3 W LEDs mounted on heatsink with thermal resistance of 2.2° C./W.
Figure 12:
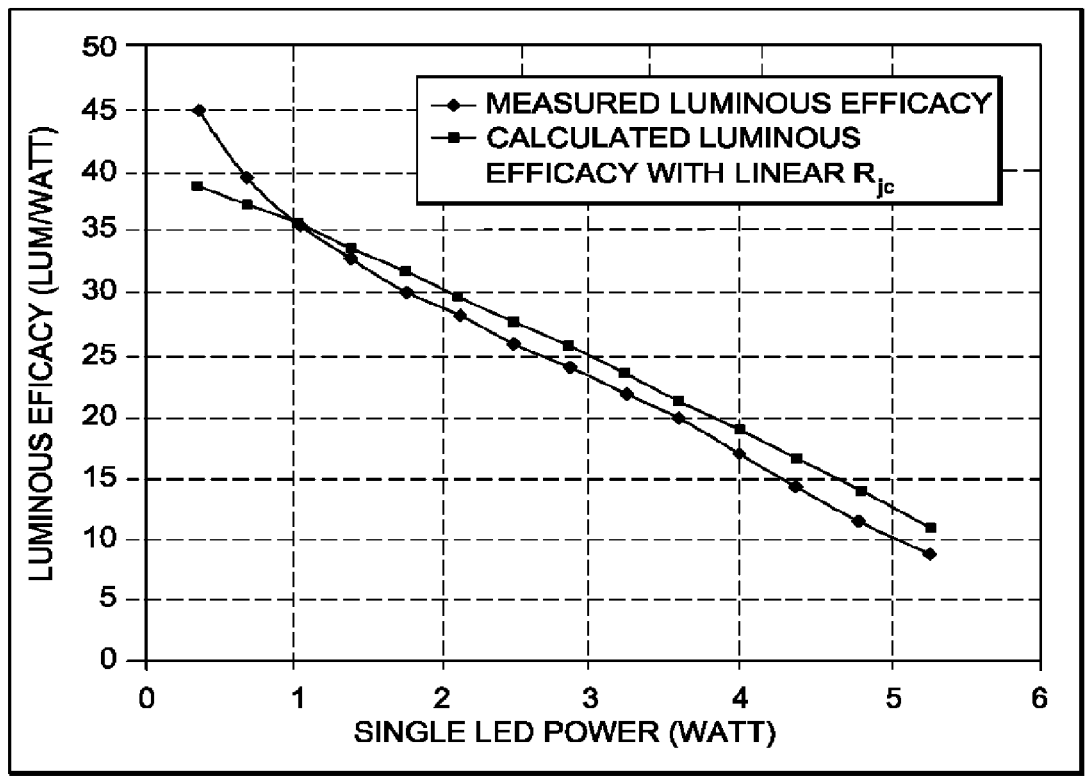
FIG. 12 shows calculated and measured total luminous efficacy versus lamp power for eight 3 W LEDs mounted on a heatsink with thermal resistance of 2.2° C./W.

Another eight 3 W LEDs are mounted on an even larger heatsink with thermal resistance of 2.2° C./W for evaluation. The measured and calculated luminous output as a function of LED power $P_d$ are shown in FIG. 11 and the corresponding results of the efficacy are included in FIG. 12.

The theoretical $P_d^*$ is now about 3.5 W, which is higher than the rated power of 3 W. This again confirms the prediction by the theory (10) that $P_d^*$ will shift to the higher power level with a decreasing term of $NR_{hs}$ (i.e., a larger heatsink with a lower $R_{hs}$). Therefore, the theory can be used to design the optimal heatsink for a particular operating power. On the other hand, it can also be used to predict the optimal operating power for a given heatsink.

B Tests on 5 W LEDs

In order to ensure that the theory can be applied to other LEDs, 5 W LEDs are used for evaluation. They are mounted on two heatsinks with thermal resistance of 6.8° C./W and 10° C./W respectively.

(i) On a Heatsink with Thermal Resistance of 10° C./W

Figure 13:
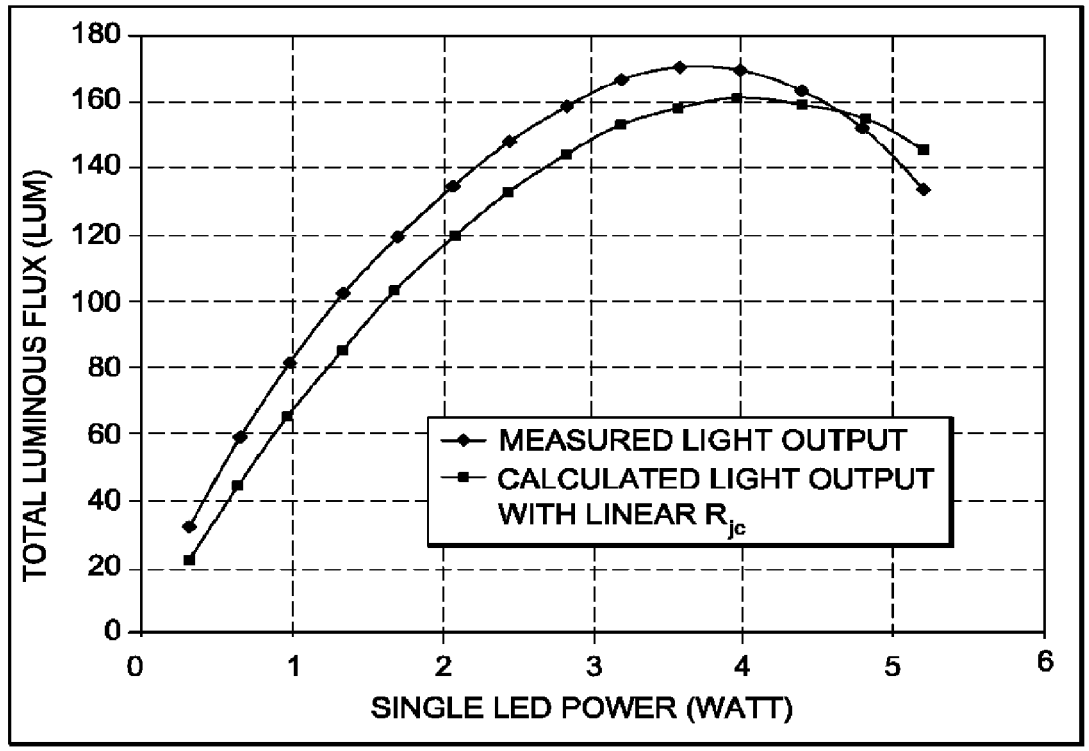
FIG. 13 shows calculated and measured total luminous flux versus lamp power for two 5 W LEDs mounted on heatsink with thermal resistance of 10° C./W.
Figure 14:
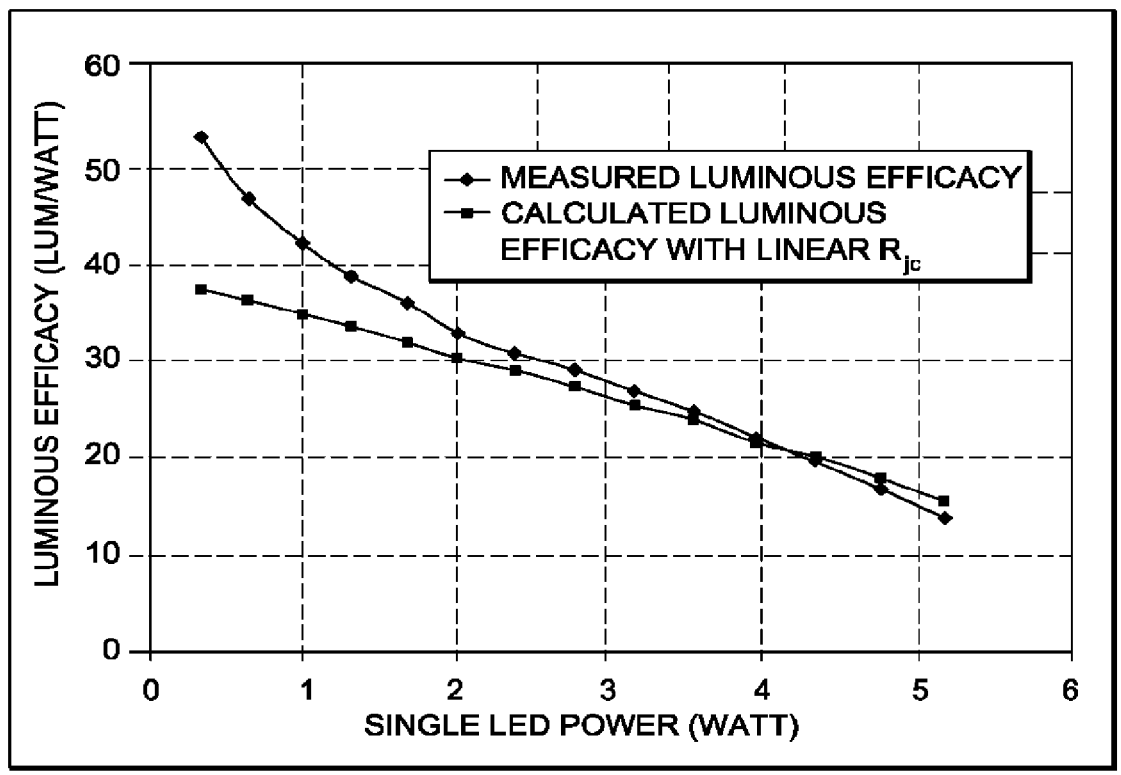
FIG. 14 shows calculated and measured total luminous efficacy versus lamp power for two 5 W LEDs mounted on a heatsink with thermal resistance of 10° C./W.

Two 5 W LEDs are mounted on a heatsink with thermal resistance of 10° C./W. For the theoretical calculation, the parameters used in (10) are $k_e=-0.00355$, $k_h=0.85$, $T_a=28°$ C., $T_0=25°$ C., $E_0=38$ Lum/W, $N=2$, $R_{hs}=10°$ C./W, $R_{jc}=13°$ C./W and $k_{jc}=0.13°$ C./W². Fitting these parameters into (7) and assuming that $R_{jc}$ will rise linearly with temperature, the luminous flux equation and the efficacy equation are expressed as (18) and (19), respectively, and they are plotted with practical measurements in FIG. 13 and FIG. 14, respectively. Despite only two 5 W LEDs being used, the theoretical predictions based on the averaged values are in general agreement with the measurements.

$$\phi_v = 75.2P_d - 7.57 P_d^2 - 0.296 P_d \quad (18)$$

$$E = 37.6 - 3.78 P_d - 0.149 P_d^2 \quad (19)$$

(ii) On a Heatsink with Thermal Resistance of 6.8° C./W

Figure 15:
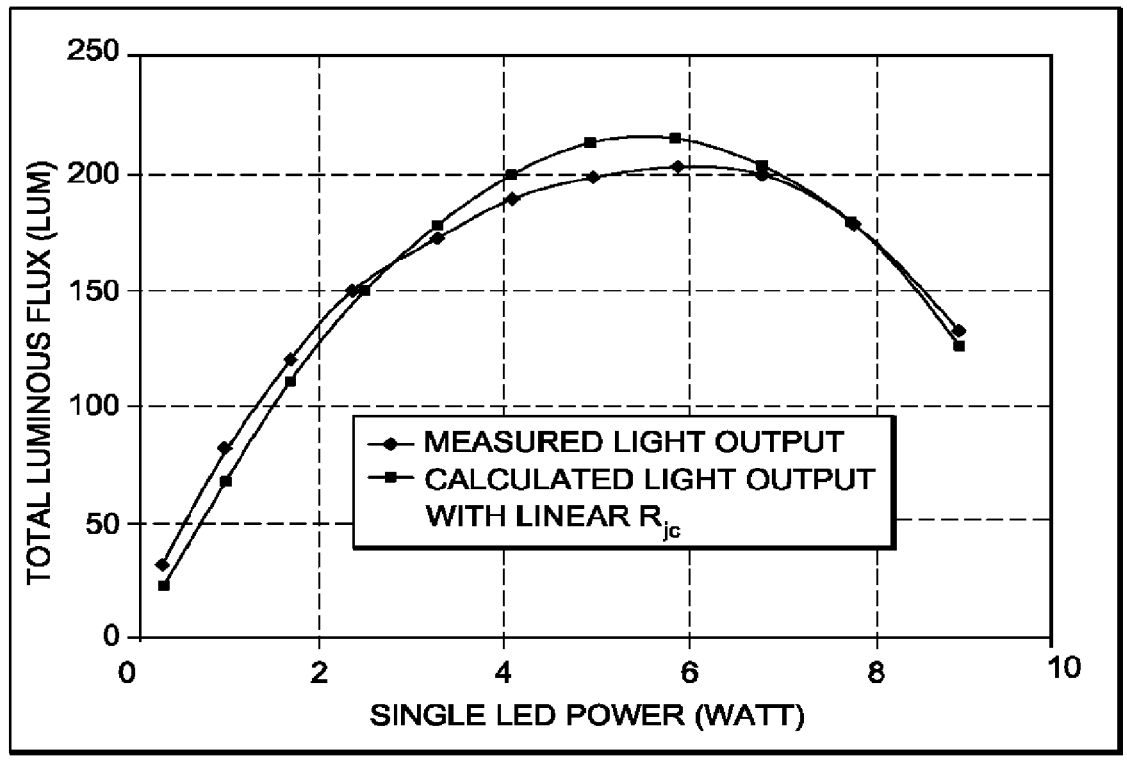
FIG. 15 shows calculated and measured total luminous flux versus lamp power for two 5 W LEDs mounted on heatsink with thermal resistance of 6.8° C./W.
Figure 16:
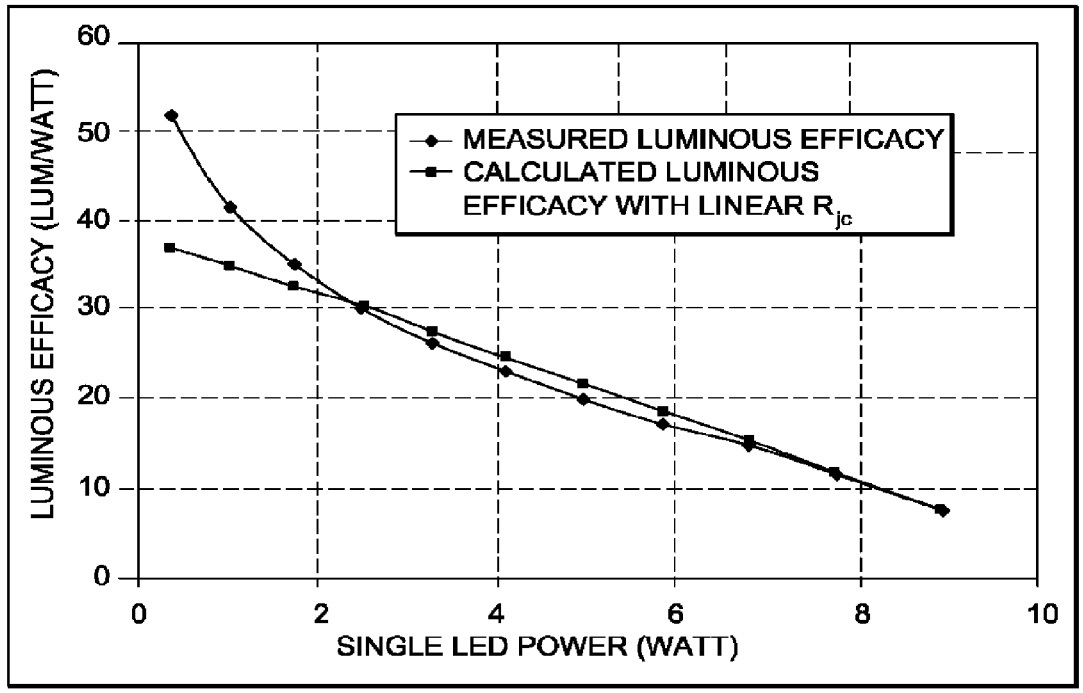
FIG. 16 shows calculated and measured total luminous efficacy versus lamp power for two 5 W LEDs mounted on a heatsink with thermal resistance of 6.8° C./W, FIG. 17 plots total luminous flux emitted as a function of LED power.

The previous experiments are repeated by mounting the two 5 W LEDs on a larger heatsink with a thermal resistance of 6.8° C./W. FIG. 15 and FIG. 16 show the comparisons of the measured and calculated luminous flux and efficacy, respectively. In general, calculated and measured results are in good agreement. Comparisons of the peak luminous flux in FIG. 13 and FIG. 14 confirm once again that using a larger heatsink (with lower thermal resistance) can shift the optimal operating point to a higher lamp power level. For the heatsink with $R_{hs}=10°$ C./W, the optimal point occurs at about 3.8 W. For the heatsink with $R_{hs}=6.8°$ C./W, this optimal point has shifted to about 6 W.

An important conclusion can be drawn from these results. The peak luminous flux (i.e., maximum $\phi_v$) occurs at a LED power $P_d^*$ that depends on the thermal design (i.e., the heatsink thermal resistance). In general, the larger the heatsink (the lower the heatsink thermal resistance or the better the cooling effects), the higher the peak luminous flux can be achieved. Since operating the LEDs at a power higher than their rated power will shorten the lifetime of LEDs drastically, the theory can be used to project the maximum luminous flux for a given thermal design. It can also be used to predict the optimal thermal design for maximum luminous flux output if the LEDs are designed to operate at rated power.

Figure 17:
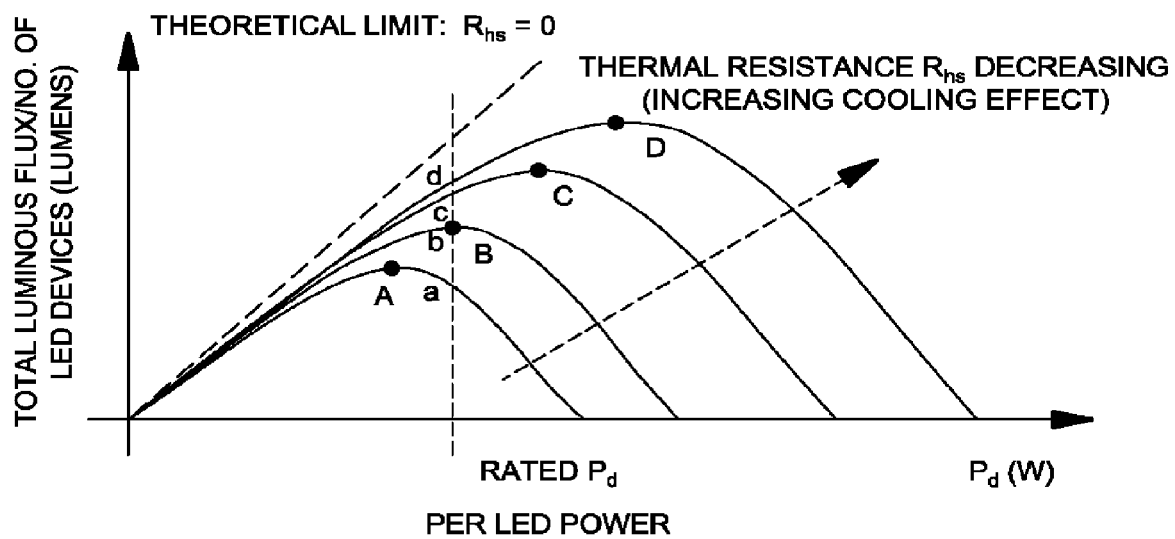

$P_d^*$ can be controlled by using different heatsinks with different thermal resistance. For a larger heatsink, $R_{hs}$ becomes small and therefore $P_d^*$ will be shifted to the higher power level as shown in FIG. 17, where the values of $P_d^*$ are labeled as A, B, C and D as the size of heatsink (or cooling effect) increases. By assuming $R_{hs}=0$, a theoretical limit can be plotted as shown in FIG. 17. It is important to note that the operating LED power must not exceed the rated LED power ($P_{rated}$) otherwise the lifetime of the LED will be shortened. Therefore, the intersection points of these curves with the rated power limit indicate how the light output can be maximized.

It should be noted that a reduction of $R_{hs}$ corresponds to an increase in the cooling effect. One way to achieve increased cooling is to increase the size of the heatsink. In FIG. 17, it can be seen that two curves with maximum points marked by C and D have relatively high luminous flux at the rated power. The curve with maximum point D has a smaller $R_{hs}$ and thus a larger heatsink than that with maximum point C. The increase of luminous flux at the rated power from using curve C to curve D is small, but the increase in the size of the heatsink is much larger in proportion.

Three important points are highlighted here:
1. The maximum $\phi_v$ is the point of inflexion of the luminous flux function (7b) or (7c). As $P_d$ increases from zero, the positive slope of the curve (i.e., $\frac{d\phi_v}{dP_d}$)

is gradually decreasing to zero when the peak of the curve is reached. A large positive slope means that a relatively small increase of $P_d$ can result in a relatively large increase of $\phi_v$. So the initial linear portion of the curve results in good efficacy. As $P_d$ is moved to the region at and around $P_d^*$, the slope is zero or relatively small. Therefore, a relatively large increase in $P_d$ will give a relatively small increase in $\phi_v$.
2. The LED power $P_d$ must not exceed the rated LED power $P_{d(rated)}$. Otherwise, the lifetime of the LED will be shortened. Therefore, the intersection points of these curves with the rated power limit should indicate how the light output can be maximized. The intersection points of these curves and the rated power line are denoted as "a", "b", "c" and "d" as shown in FIG. 17.
3. The values of $\phi_v$ at "c" and "d" are higher than that at "b". But the curve with peak $\phi_v$ at D requires a much larger heatsink than that with peak $\phi_v$ at C. The difference of $\phi_v$ at "c" and "d" may not be significant enough to justify an increase in cost and size of the heatsink.

The following rules are proposed as an optimization.
Rule 1:
The function of the luminous flux $\phi_v$ versus LED power $P_d$ is a parabolic curve with a maximum point. The operating point $P_d$ should be chosen at or below the maximum point $P_d^*$. This means that for a given luminous flux output, the lower LED power should be chosen. Within this recommended power range, either (7) or (14) can provide sufficiently accurate predictions.
Rule 2:
If the thermal design is restricted by limited space for the heatsink so that the $P_d^*$ occurs at a power less than or equal to the rated power $P_{(rated)}$, then the LED system should be operated at $P_d^*$ for each LED device. [For example, points A and B are optimal operating points for the respective curves as their $P_d^*$ values do not exceed $P_{(rated)}$.]
Rule 3:
If the thermal design is flexible, then the LED system should be designed in such a way that (i) the theoretical maximum $\phi_v$ point (or $P_d^*$) occurs at a power higher than $P_{(rated)}$ of the LED and (ii) the intersection point of the theoretical $\phi_v$–$P_d$ curve and the rated power line should have a value of about 80% to 96% of the theoretical maximum $\phi_v$ value. The rated power should be chosen as the operating power for each LED.

Figure 18:
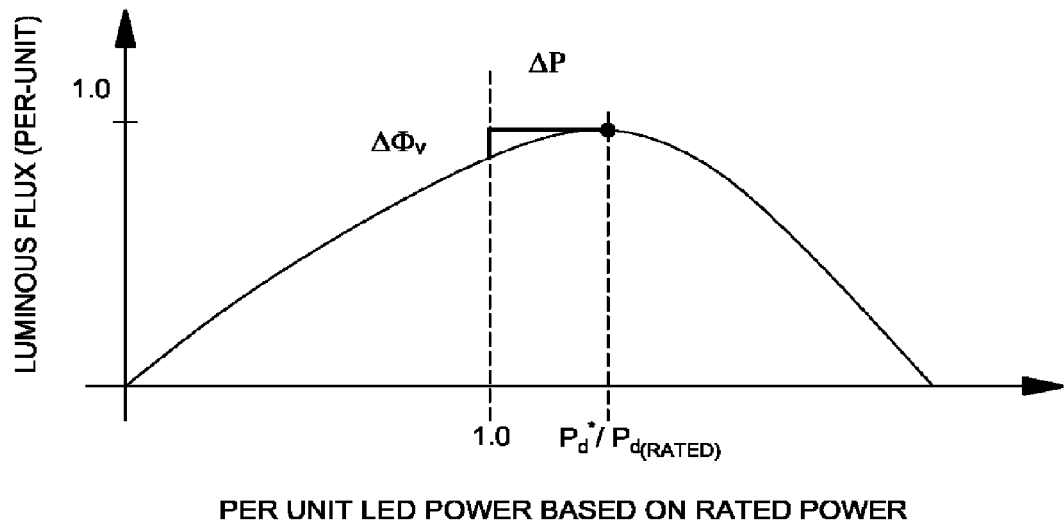
FIG. 18 illustrates in more detail one embodiment of the invention where an LED is operated below the peak value of emitted luminous flux.

Rule 3 is an important idea. Where the theoretical maximum ($P_d^*$ for maximum $\phi_v$) occurs at a point higher than the rated power, one should still operate the LED system at the rated power. As can be seen from FIGS. 17 and 18 the slope of the curve shows that as $P_d^*$ is approached the increase in luminous flux becomes very small and in terms of efficiency the gain in flux is not worth the additional power used. By using $\Delta\phi_v|_{pu}=0.04\sim0.20$ of the maximum $\phi_v$ point in the curve the 4%-20% range for $\Delta\phi_v$ from the maximum $\phi_v$ point offers a good compromise of the light output and the size and thus cost of the heatsink.

Figure 19:
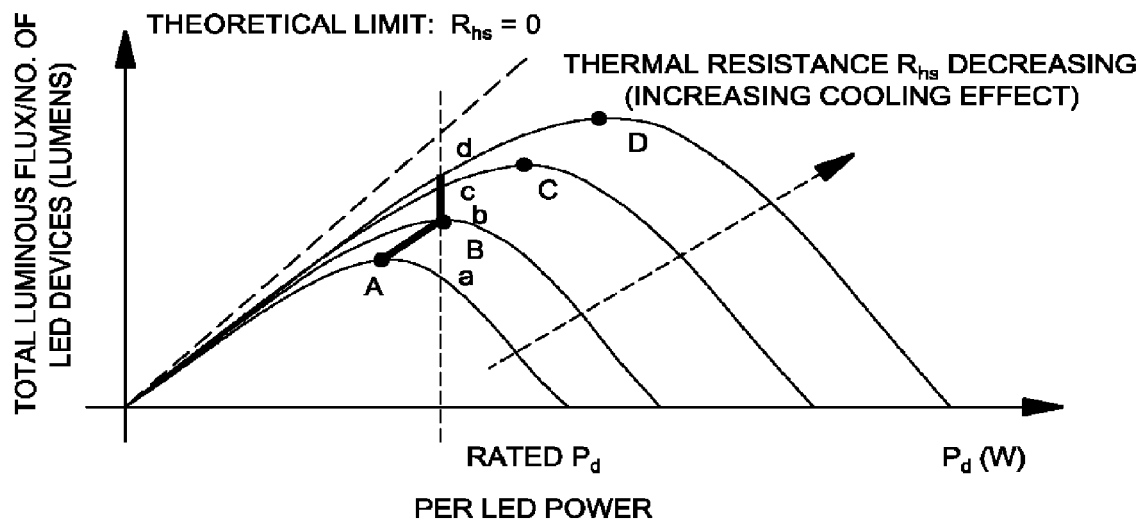
FIG. 19 illustrates the operating principles in the context of forced cooling.

If forced cooling is applied, the $\phi_v$–$P_d$ curve will change dynamically. This can be visualized as having a dynamically changing thermal resistance $R_{hs}$. The optimal operating point should follow the three rules explained previously. It should be kept along the operating lines as highlighted in the bold solid lines in FIG. 19 in order to maximize the luminous flux output.

Figure 20:
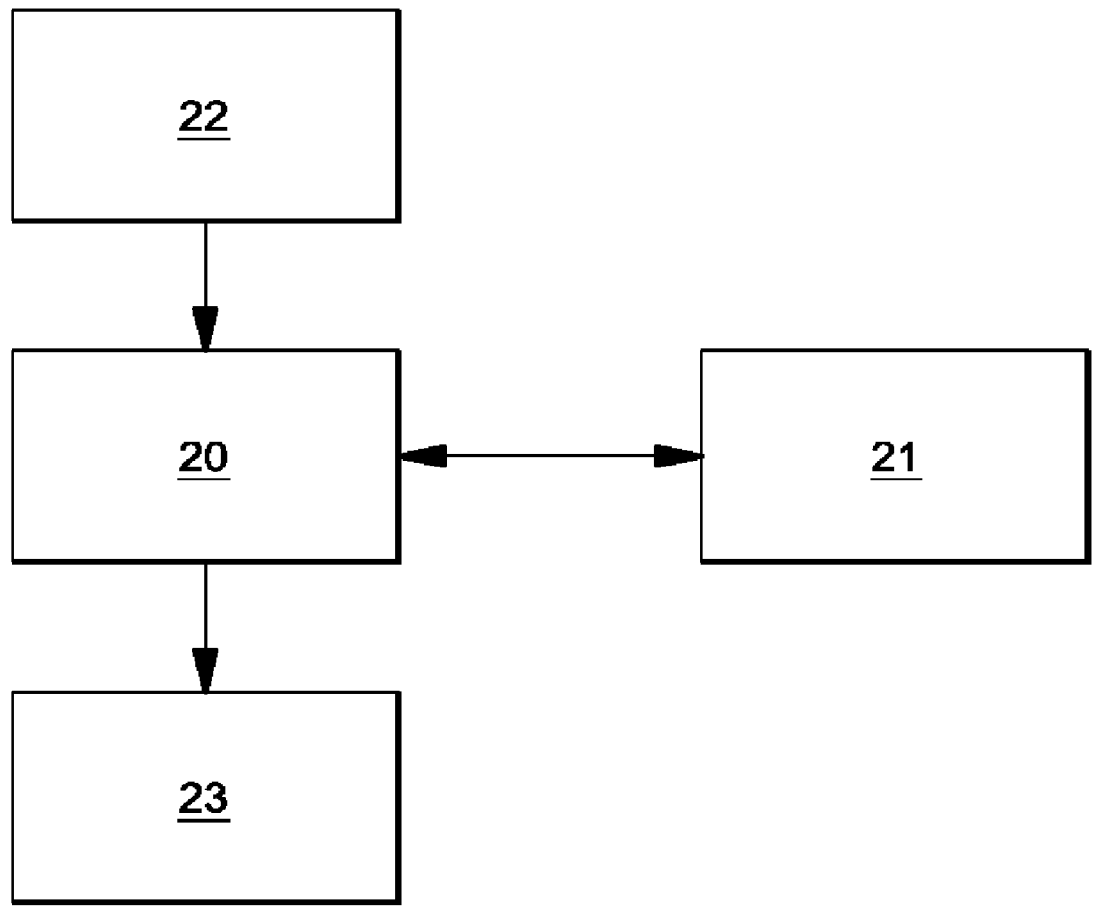
FIG. 20 shows an apparatus that may implement embodiments of the invention.

FIG. 20 shows schematically an apparatus that may be used in embodiments of the invention. The apparatus comprises a microprocessor control unit (MCU) 20 that performs functions to be described below, database 21, user input means 22 which may be a keyboard, touchscreen or any other means that enables a user to display data, and output display means 23 which may be a screen, print out or any other means for data output to be communicated to a user. Database 21 includes details obtained from datasheets of the physical and electrical parameters of all known commercially available LEDs. This database may be provided directly as part of the apparatus or may a database kept elsewhere and accessed remotely. A user will input selected parameters of a desired LED lighting system using input means 22. These parameters will include at least the desired luminous flux output required from the system, and may further include any other parameters that the user wishes to fix, including for example the number N of LEDs and the size of the heatsink if that is fixed.

Figure 21:
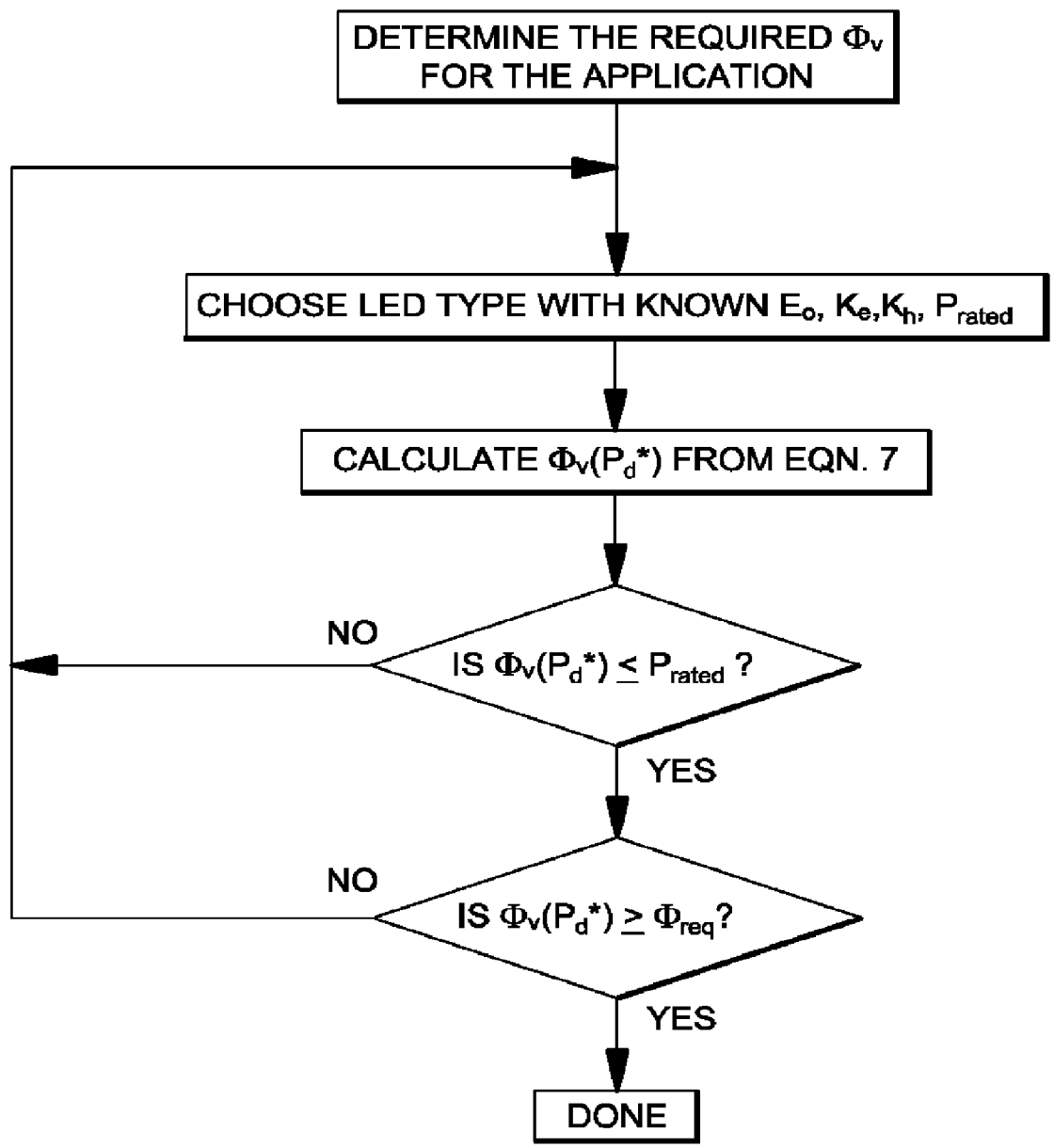
FIG. 21 shows a flowchart illustrating the use of an embodiment of the invention, and FIG. 22 shoes a further flowchart illustrating the use of an embodiment of the invention.
Figure 22:
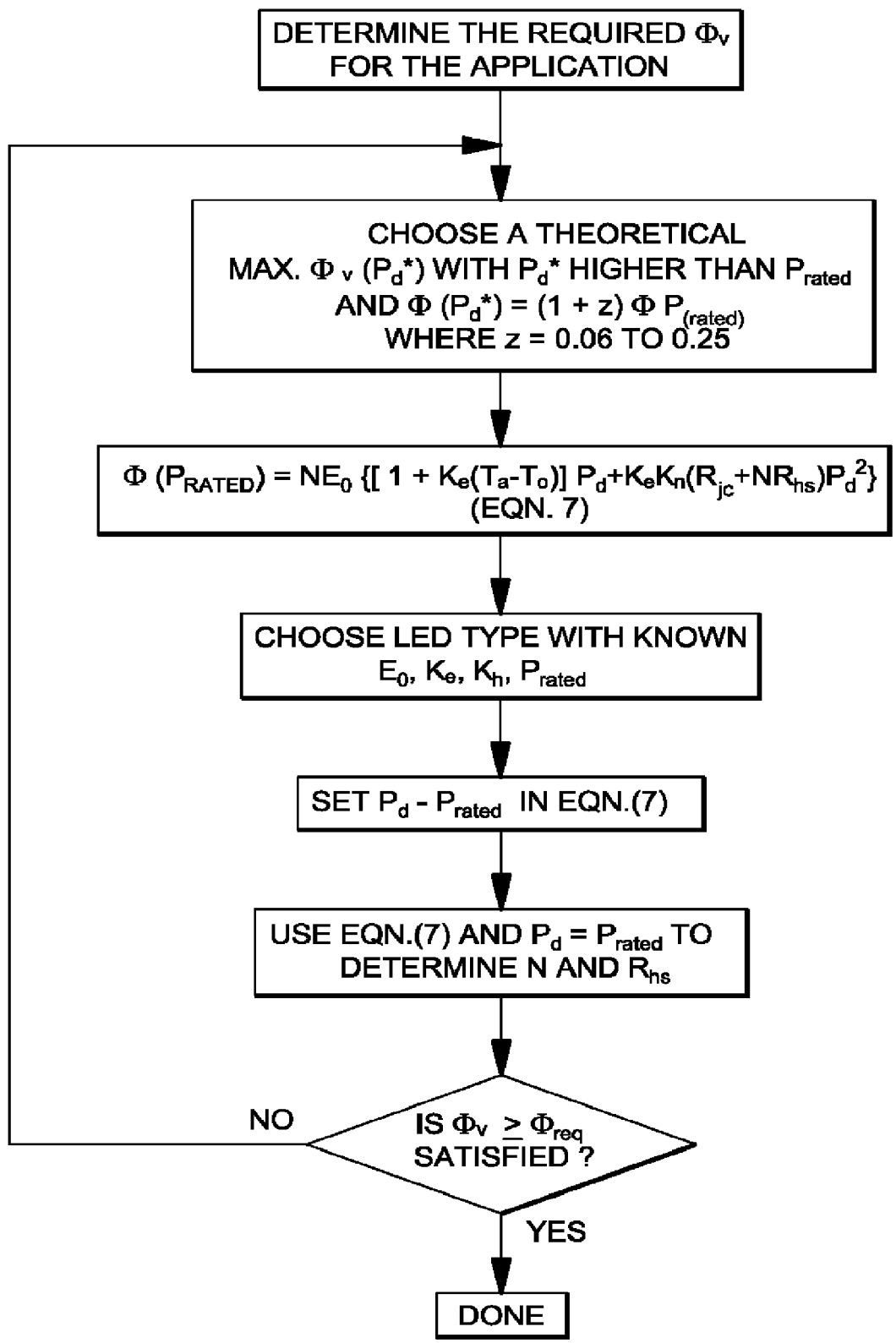

MCU 20 is programmed to carry out the steps shown in the flowcharts of FIGS. 21 and 22. Beginning with FIG. 21, a user may input a required flux output $\phi_v$. The MCU may then select a candidate LED from the database and calculated the maximum flux that the LED is capable of achieving from Eq. 7 above. If this maximum flux is obtained at a power below the rated power, and if this maximum flux is equal to or greater than the required flux, then such an LED is capable of being used in an LED system meeting the desired flux output and the process can stop. If the answer to either question is negative, i.e., if the maximum flux would only be obtained at a power greater than the rated power, or if the maximum flux is insufficient, then another LED is chosen and the process repeats.

If no LED can be found by the process of FIG. 21, either after a number of attempts or after all LEDs in the database have been exhausted, the MCU runs the process of FIG. 22 (or alternatively a user may go directly to the process of FIG. 22 if preferred). This process corresponds to the situation where the peak of the flux output occurs at a power above the rated power. In such cases, as discussed above, it is preferable to select an LED with a peak flux output such that the maximum rated power is between 80% and 96% of the power at which the maximum flux is obtained. As can be seen from lines C and D in FIG. 17 the output of these lines where they cross the rated power is higher than the equivalent flux of an LED that has its peak flux output exactly when operated at the rated power (the condition of line B). In FIG. 21 a peak output is calculated by the MCU at a power higher than a rated power and then various LEDs are chosen from the database until one is found where the flux output $\phi_v$ at the rated power is equal to or greater than the required power $\phi_{req}$.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of forming an LED illumination system comprising one or more LEDs on a heatsink with a desired output flux, the method comprising steps of:
   (a) modeling on a computer a luminous flux emitted by said LED illumination system as a function of a thermal resistance of said heatsink and power applied to each of the one or more LEDs, and
   (b) selecting an LED illumination system such that either:
      (i) a maximum luminous flux is emitted at a power equal to or below a rated power of said LED illumination system and said maximum luminous flux is equal to or greater than the desired output flux, or
      (ii) a rated power of said LED illumination system is below a power at which a maximum luminous flux is emitted, provided that a flux emitted by said LED system at said rated power is equal to or greater than the desired output flux.

2. The method of claim 1, wherein in step (b)(ii) the rated power is between 80% and 96% of the power at which the maximum luminous flux would be output.

3. A method of forming an LED illumination system comprising one or more LEDs on a heatsink with a desired output flux, the method comprising steps of:
   (a) modeling on a computer a luminous flux emitted by said LED illumination system as a function of a thermal resistance of said heatsink and power applied to each of the one or more LEDs, and
   (b) selecting a heatsink having a thermal resistance such that either:
      (i) a maximum luminous flux is emitted at a power equal to or below a rated power of said one or more LEDs, or
      (ii) a rated power of said LED illumination system is below a power at which a maximum luminous flux is emitted, provided that a flux emitted by said LED illumination system at said rated power is equal to or greater than the desired output flux.

4. The method of claim 3, wherein in step (b)(ii) the rated power is between 80% and 96% of a power at which the maximum luminous flux would be output.

5. An LED illumination system comprising a plurality of LEDs on a heatsink, wherein said heatsink has a thermal resistance such that a maximum luminous flux is emitted at a power below a rated power of said plurality of LEDs.

6. A method of forming an LED illumination system comprising a plurality of LEDs on a heatsink with a desired output flux, the method comprising:
   selecting an LED illumination system such that either:
      (i) a maximum luminous flux is emitted at a power below a rated power of said LED illumination system and said maximum luminous flux is equal to or greater than the desired output flux, or
      (ii) a rated power of said LED illumination system is below a power at which a maximum luminous flux is emitted, provided that a flux emitted by said LED illumination system at said rated power is equal to or greater than the desired output flux.

7. The method of claim 6, wherein in (ii) the rated power is between 80% and 96% of the power at which the maximum luminous flux would be output.

8. A method of forming an LED illumination system comprising a plurality of LEDs on a heatsink with a desired output flux, the method comprising:
   selecting a heatsink having a thermal resistance such that either:
      (i) a maximum luminous flux is emitted at a power below a rated power of said plurality of LEDs, or
      (ii) a rated power of said LED illumination system is below a power at which a maximum luminous flux is emitted, provided that a flux emitted by said LED illumination system at said rated power is equal to or greater than the desired output flux.

9. The method of claim 8, wherein in (ii) the rated power is between 80% and 96% of the power at which the maximum luminous flux would be output.

* * * * *